US007619470B2

(12) United States Patent
Abe et al.

(10) Patent No.: US 7,619,470 B2
(45) Date of Patent: Nov. 17, 2009

(54) POWER AMPLIFIER (75) Inventors: Kazuhide Abe, Kawasaki (JP);
Tadahiro Sasaki, Tokyo (JP); Kazuhiko Itaya, Yokohama (JP); Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 45 days.

(21) Appl. No.: 11/687,770

(22) Filed: Mar. 19, 2007

(65) Prior Publication Data
US 2008/0061871 A1 Mar. 13, 2008

(30) Foreign Application Priority Data
Jun. 27, 2006 (JP) ............... 2006-176651

(51) Int. Cl.
*H03F 3/217* (2006.01)
(52) U.S. Cl. .................................. 330/251
(58) Field of Classification Search .......... 330/51, 330/251, 295
See application file for complete search history.

(56) References Cited
U.S. PATENT DOCUMENTS

| 4,164,714 A * | 8/1979 | Swanson ............... 330/10 |
| 4,580,111 A | 4/1986 | Swanson |
| 5,731,603 A | 3/1998 | Nakagawa et al. |
| 5,777,371 A | 7/1998 | Kawaguchi et al. |
| 5,920,087 A | 7/1999 | Nakagawa et al. |
| 5,985,708 A | 11/1999 | Nakagawa et al. |
| 6,064,086 A | 5/2000 | Nakagawa et al. |
| 6,069,396 A | 5/2000 | Funaki |
| 6,134,424 A | 10/2000 | Nishihori et al. |
| 6,163,051 A | 12/2000 | Nakagawa et al. |
| 6,300,830 B1 | 10/2001 | Pehlke |
| 6,737,973 B2 * | 5/2004 | Jesme ................. 340/572.1 |
| 6,784,732 B2 * | 8/2004 | Hajimiri et al. ........... 330/251 |
| 6,819,171 B2 | 11/2004 | Kenington |

(Continued)

FOREIGN PATENT DOCUMENTS

JP      04-287105      10/1992

(Continued)

OTHER PUBLICATIONS

U.S. Appl. No. 11/857,737, filed Sep. 19, 2007, Sasaki, et al.

(Continued)

*Primary Examiner*—Steven J Mottola
(74) *Attorney, Agent, or Firm*—Oblon, Spivak, McClelland, Maier & Neustadt, L.L.P.

(57) ABSTRACT

A power amplifier includes: a plurality of field effect transistors connected in parallel and each having a first and second ends, the first end being connected to ground; an amplifying unit which includes at least one of an inductor, a capacitor and a band pass filter and has a third and fourth ends, the third end being connected to the second ends of the field effect transistors, and the fourth end outputting an amplified output signal; and an amplitude controller which sends control signals respectively to gates of the field effect transistors to turn on or off the field effect transistors based on an address signal for performing selection on the field effect transistors and a clock signal. Channel widths of the field effect transistors are different from each other.

9 Claims, 11 Drawing Sheets

U.S. PATENT DOCUMENTS

| | | | |
|---|---|---|---|
| 6,909,326 B2 * | 6/2005 | Jesme | 330/251 |
| 7,026,204 B2 * | 4/2006 | Brech | 438/197 |
| 7,126,428 B2 * | 10/2006 | Lin et al. | 330/311 |
| 7,170,359 B2 * | 1/2007 | Koerner | 331/183 |
| 7,276,976 B2 * | 10/2007 | Oh et al. | 330/311 |
| 7,352,247 B2 * | 4/2008 | Oh et al. | 330/311 |
| 7,385,445 B2 * | 6/2008 | Wright | 330/51 |
| 7,460,612 B2 * | 12/2008 | Eliezer et al. | 375/295 |
| 2005/0030104 A1 | 2/2005 | Chen et al. | |
| 2007/0126504 A1 * | 6/2007 | Macphail | 330/251 |
| 2007/0285175 A1 * | 12/2007 | Oh et al. | 330/311 |
| 2008/0094141 A1 * | 4/2008 | Gotou et al. | 330/295 |

FOREIGN PATENT DOCUMENTS

| | | |
|---|---|---|
| JP | 05-167364 | 7/1993 |
| JP | 7-74549 | 3/1995 |
| JP | 7-142934 | 6/1995 |
| JP | 08-255034 | 10/1996 |
| JP | 2000-40705 | 2/2000 |
| JP | 2000-138598 | 5/2000 |
| JP | 2001-267856 | 9/2001 |
| JP | 2002-344243 | 11/2002 |
| JP | 2003-110636 | 4/2003 |
| JP | 2003-523123 | 7/2003 |
| JP | 2004-517541 | 6/2004 |
| JP | 2004-260364 | 9/2004 |
| JP | 2004-336445 | 11/2004 |
| JP | 2005-086673 | 3/2005 |
| JP | 2005-101948 | 4/2005 |

OTHER PUBLICATIONS

U.S. Appl. No. 11/871,451, filed Oct. 12, 2007, Abe, et al.
U.S. Appl. No. 08/207,849, filed Mar. 9, 1994, Ichiro Omura.
Alireza Shirvani, et al., "A CMOS RF Power Amplifier With Parallel Amplification for Efficient Power Control", IEEE Journal of Solid-State Circuits, vol. 37, No. 6, Jun. 2002, pp. 684-693.
U.S. Appl. No. 12/276,787, filed Nov. 24, 2008, Abe, et al.
U.S. Appl. No. 12/409,926, filed Mar. 24, 2009, Abe, et al.

* cited by examiner

| a0 | a1 | b0 | b1 | b2 | b3 |
|---|---|---|---|---|---|
| 0 | 0 | 1 | 0 | 0 | 0 |
| 0 | 1 | 1 | 1 | 0 | 0 |
| 1 | 0 | 1 | 1 | 1 | 0 |
| 1 | 1 | 1 | 1 | 1 | 1 |

ON : 1
OFF : 0

POWER AMPLIFIER

CROSS-REFERENCE TO RELATED APPLICATION

This application is based upon and claims the benefit of priority from prior Japanese Patent Application No. 2006-176651 filed on Jun. 27, 2006 in Japan, the entire contents of which are incorporated herein by reference.

BACKGROUND OF THE INVENTION

1. Field of the Invention

The present invention relates to a power amplifier

2. Related Art

In the conventional portable radio terminals, a large number of power amplifiers using a compound semiconductor in a final amplification stage are used. As the CMOS process becomes finer, however, efforts are continued to implement not only the baseband circuit but also the high frequency analog circuit at the front end by using CMOS circuits. Partially, they are already commercially available. As compared with the compound semiconductor process, the CMOS integrated circuit process has a feature that it is comparatively inexpensive per unit area.

The power amplifier is demanded to have high power efficiency in order to implement long time battery drive for the portable terminal. On the other hand, as higher data transmission rates are strongly demanded, more complicated modulation systems tend to be introduced in communication systems and as a result, high linearity is required for the power amplifier.

In case the power amplifier is formed of only one final-stage transistor, and the power amplifier is driven with small amplitude, the linearity between the input signal and the output signal is better, but the power efficiency is lower. On the other hand, if the power amplifier is driven with large amplitude, the power efficiency is higher, but the amplitude of the output signal is saturated, resulting in the worse linearity to become worse. In other words, there used to be a problem in a power amplifier that the efficiency and the linearity were in relation for trade-off each other.

As means to implement a power amplifier having a high power efficiency, a method in which a power amplifier is divided into a plurality of saturation amplifying units connected in parallel and synthesizing their outputs is proposed (for example, see JP-A 2005-86673 (KOKAI)). According to the power amplifier disclosed in JP-A 2005-86673 (KOKAI), a plurality of amplifying units are provided and driven in an efficient saturation region in each of the amplifying units. In order to change the amplitude of the output power, the number of driven amplifying units is controlled. In implementing the linearity, therefore, it is necessary to provide a controller separately to turn on/off the individual amplifying units. It is possible to integrate such a controller on the same semiconductor chip with the same amplifying units by using digital logic circuits using the CMOS process. A relation between amplitude a(t) of a modulation signal and the number n of saturation amplifying units turned on by the controller is indicated in JP-A 2005-86673 (KOKAI). A relation between an amplitude of a modulation signal and an amplitude of an output signal obtained as a result of the above-described on/off control is shown in FIG. 10 in JP-A 2005-86673 (KOKAI). It is also disclosed that saturation output powers of the individual amplifying units in the amplifying units need not be necessarily equal and the amplifying units can also be implemented by providing the individual amplifying units with relations of powers of 2. Owing to such a configuration, an amplified signal having less distortion is obtained even in a non-constant amplitude signal (a signal which is not constant in amplitude).

If the technique described in JP-A 2005-86673 (KOKAI) is implemented, it should be possible to solve the problem in the conventional power amplifier, i.e., relation of trade-off between the power efficiency and the linearity. As a matter of course, for implementing the above-described technique in practical use, however, it becomes necessary to solve some extremely serious difficulties.

First, in the first embodiment in JP-A 2005-86673 (KOKAI), it is described that an F-class amplifier utilizing FETs can be used as an example of the saturation amplifying unit. As compared with an A-class amplifier or a B-class amplifier, the F-class amplifier has a feature that high power efficiency is obtained. If it is attempted to implement the individual saturation amplifying units by using the F-class amplifiers, it is necessary to connect an inductance between a power supply voltage $V_{DD}$ and a FET and connect a transmission line having a quarter wavelength between the FET and an output terminal as described in a paper (Alireza Shirvani, David K. Su, and Bruce A. Wooley, "A CMOS RF Power Amplifier With Parallel Amplification For Efficient Power Control", IEEE JOURNAL OF SOLID-STATE CIRCUITS, VOL. 37, NO. 6, JUNE 2002) cited in JP-A 2005-86673 (KOKAI). If such inductance and transmission line are formed on the same substrate as the FET, an extremely large area becomes necessary. Because passive elements such as the inductance and the transmission line formed on the semiconductor substrate needs an area larger than that of the FET itself.

In JP-A 2005-86673 (KOKAI), the F-class amplifier is implemented by using the CMOS process. The advantage of using the CMOS process is that the process cost per unit area is lower than that with a compound semiconductor such as GaAs. If as many passive parts such as inductances and transmission lines as the number of saturation amplifying units are necessary, however, the chip area occupied by the passive parts is also compelled to become extremely large, because JP-A-2005-86673 is implicitly based on the assumption that a large number of amplifying units enough to ensure the linearity are provided. This is contradictory to the original object that the CMOS process is used to implement inexpensive amplifiers.

Secondly, if there is the above-described problem, i.e., if it is not rational in the cost aspect to provide many inductors and transmission lines in the individual amplifying units, then another possible choice is that passive parts are not provided in each individual amplifying units. It is conceivable to adopt a method of forming each of individual amplifying units of only active parts (FETs) which can be reduced in size as small as possible and instead ensuring the impedance-matching with the output terminal on the output unit side. In a different configuration example of an output power synthesizing circuit described in JP-A 2005-86673 (KOKAI), a plurality of parallel reactance elements are provided in the output power synthesizing circuit and it is attempted to achieve impedance matching depending upon the number of saturation amplifying units in use by changing over the parallel reactance elements with switches in response to a signal supplied from an amplitude controller.

Even if impedance matching should be implemented between each amplifying unit and the output terminal by using the above-described method, however, it becomes necessary to provide a plurality of reactance elements in the output power synthesizing circuit also in this case. Eventually, there is only difference between providing passive elements in the saturation amplifying units and providing the passive elements in the output compounding circuit. There is no change in that a large number of passive elements are needed, i.e., a large area is needed as a result.

In summary of the conventional art, if the single F-class amplifier is used and only a constant-amplitude signal is amplified in the saturation region, extremely high power efficiency can be obtained. If it is attempted to implement a system in which the amplifier is divided into a plurality of saturation amplifying units to use as an amplifier having a non-constant amplitude and the selected number of amplifying units is controlled by a digital logic circuit, however, a number of passive parts is necessary, and occupy a large chip area. Eventually, therefore, it is not reasonable in the cost aspect.

SUMMARY OF THE INVENTION

The present invention has been made in view of these circumstances, and an object is to provide a power amplifier which is inexpensive as far as possible, which can reconcile the relation of trade-off between the power efficiency and the linearity, and which can make the output amplitude variable.

A power amplifier according to a first aspect of the present invention includes: a plurality of field effect transistors connected in parallel and each having a first and second ends, the first end being connected to ground, and channel widths of the field effect transistors being different from each other; an amplifying unit which comprises at least one of an inductor, a capacitor and a band pass filter and has a third and fourth ends, the third end being connected to the second ends of the field effect transistors, and the fourth end outputting an amplified output signal; and an amplitude controller which sends control signals respectively to gates of the field effect transistors to turn on or off the field effect transistors based on an address signal for performing selection on the field effect transistors and a clock signal.

A power amplifier according to a second aspect of the present invention includes: a plurality of switches connected in parallel and each having a first and second ends, the first end being connected to ground, and on-resistance values of the switches being different from each other; an amplifying unit which comprises at least one of an inductor, a capacitor and a band pass filter and has a third and fourth ends, the third end being connected to the second ends of the switches, and the fourth end outputting an amplified output signal; and an amplitude controller which sends control signals respectively to the switches to turn on or off the switches based on an address signal for performing selection on the switches and a clock signal.

DETAILED DESCRIPTION OF THE INVENTION

Before describing a power amplifier according to an embodiment of the present invention, the course of events for achieving the present invention will be described below.

Figure 1:
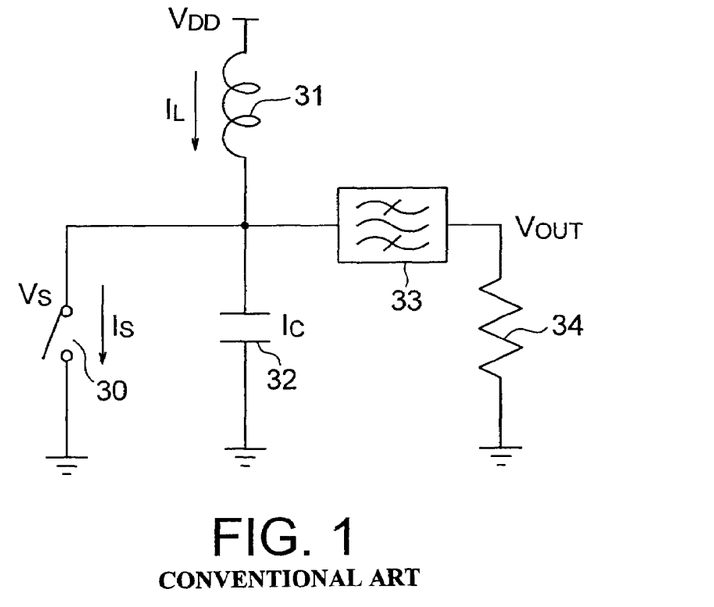
FIG. 1 is a circuit diagram showing an E-class amplifier.
Figure 2:
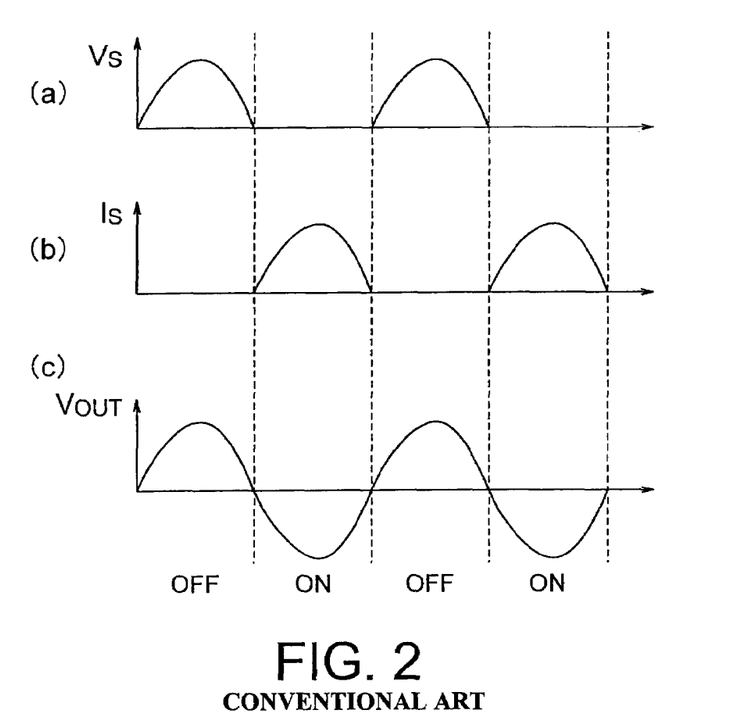
FIGS. 2(a), 2(b) and 2(c) are waveform diagrams of the E-class amplifier shown in FIG. 1.

The present inventors have suspected that E-class amplifiers might be able to be used as amplifying units in the power amplifier. FIG. 1 shows a configuration of an E-class amplifier. The E-class amplifier includes a switch 30, an inductor 31, a capacitor 32, a band pass filter 33, and a resistor 34. Denoting a potential at a common node of the switch 30, the inductor 31, the capacitor 32 and the band pass filter 33 by Vs, a current flowing through the switch 30 by Is, and a potential at a node between the band pass filter 33 and the resistor 34 by Vout, operation waveforms of the E-class amplifier obtained by repeating alternately turning on and off the switch 30 are shown in FIGS. 2(a), 2(b) and 2(c). As for the operation of the E-class amplifier, see, for example, Mona M. Hella, Mohammed Ismail, "RF CMOS Power Amplifiers Theory, Design and Implementation", Kluwer Academic Publishers, 2001.

In the E-class amplifier, a transistor is used as the switch 30. Therefore, the E-class amplifier has a feature that is compatible with the fine CMOS process. In addition, since the voltage waveform and the current waveform overlap little in time, extremely high power efficiency can be anticipated.

Figure 3:
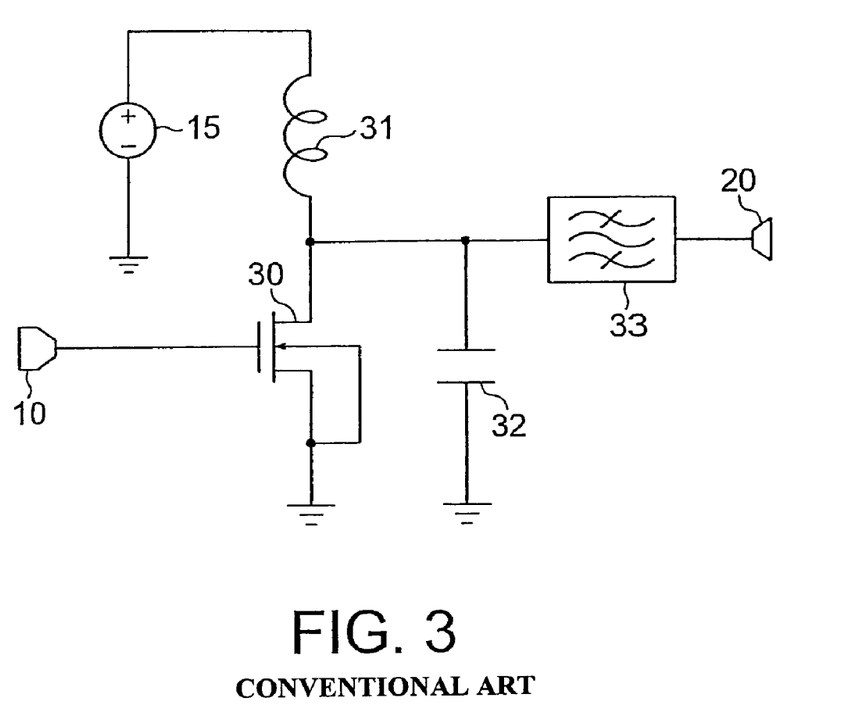
FIG. 3 is a circuit diagram showing an E-class amplifier using an N-type MOSFET as a switch.
Figure 4:
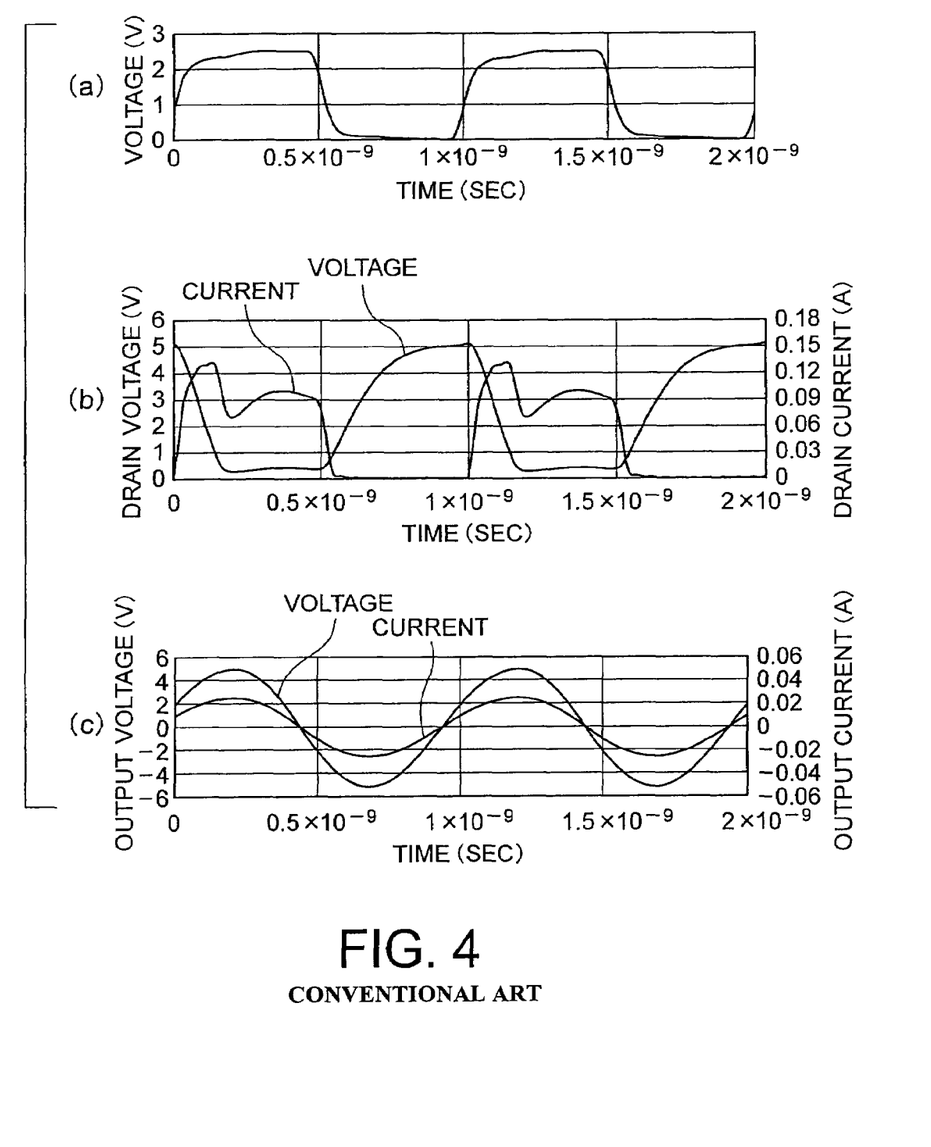
FIGS. 4(a), 4(b) and 4(c) are diagrams showing simulation results of operation conducted when a rectangular waveform is input to the E-class amplifier shown in FIG. 3.

A circuit configuration of the E-class amplifier with an N-type MOSFET used as the switch 30 is shown in FIG. 3. Results of the circuit simulation of the E-class amplifier are shown in FIGS. 4(a), 4(b) and 4(c). The E-class amplifier includes an input terminal 10, a direct current voltage source 15, an inductor 31, a switch 30 (herein referred to as N-type MOSFET 30), a capacitor 32, a band pass filter 33, and an output terminal 20. A rectangular waveform having a frequency of 2.5 GHz and voltage amplitude of 2.5 V shown in FIG. 4(a) is input to the input terminal 10 of the E-class amplifier. It is confirmed that a sine waveform having the same frequency 2.5 GHz can be obtained at the output terminal 20 having an output impedance of 50 ohms (FIG. 4(c)). In addition, the voltage waveform and the current waveform at the drain of the N-type MOSFET 30 have little overlap in time as shown in FIG. 4(b). Theoretically, therefore, the power efficiency is expected to be high.

Figure 5:
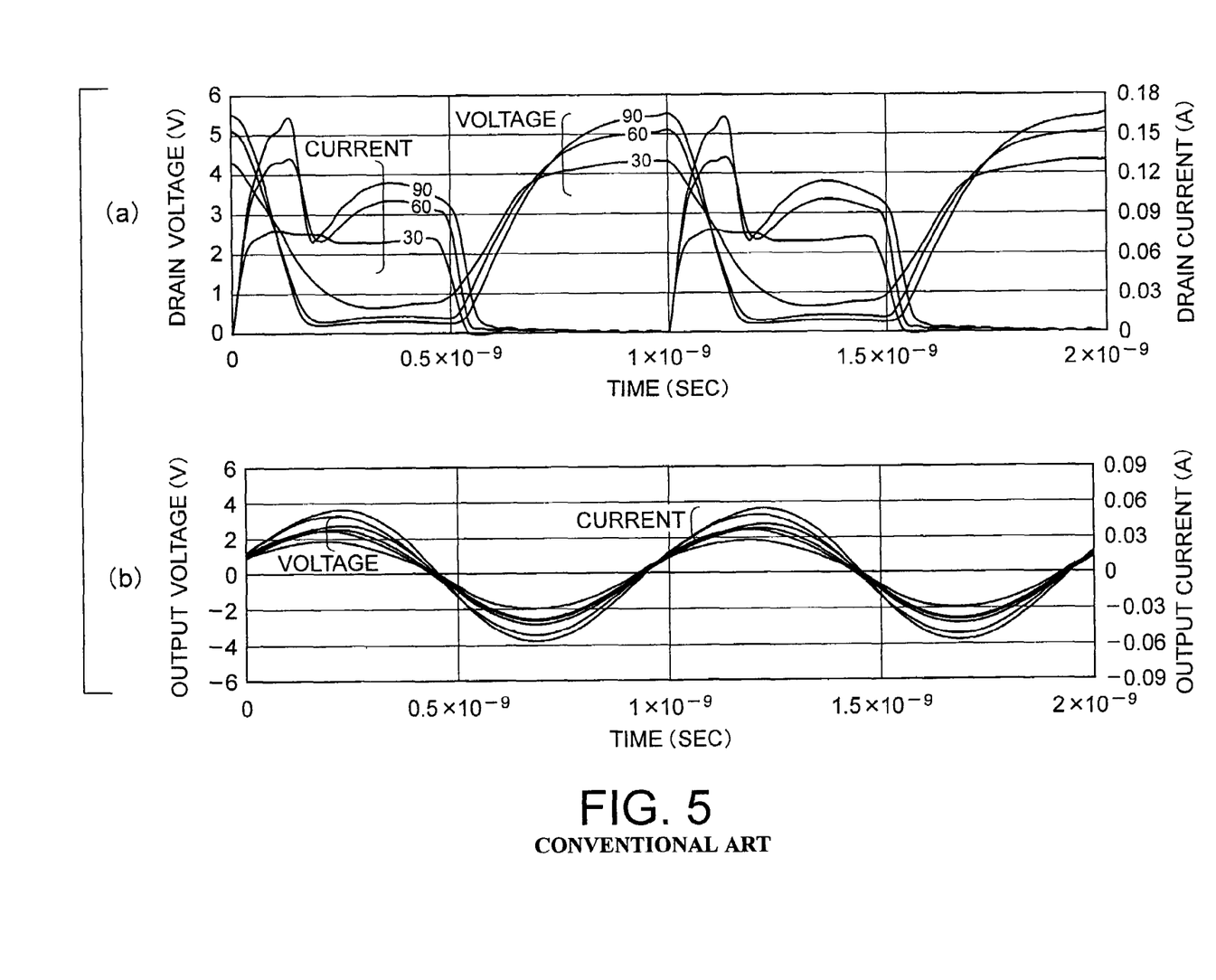
FIGS. 5(a) and 5(b) are diagrams showing simulation results of operation conducted when a gate width for the N-type MOSFET is changed in the E-class amplifier shown in FIG. 3.

Operation waveforms of the E-class amplifier with the number of gate fingers in the N-type MOSFET 30 changed in the circuit configuration of the E-class amplifier shown in FIG. 3 are simulated by the present inventors, and shown in FIGS. 5(a) and 5(b). FIG. 5(a) shows drain voltage waveforms and drain current waveforms obtained when a gate width W of the N-type MOSFET 30 is fixed to 5.2 μm and the number of gate fingers Mgate is set equal to 30, 60 and 90. FIG. 5(b) shows output voltage waveforms and output current waveforms obtained when the gate width W of the N-type MOSFET 30 is set equal to 5.2 μm and the number of gate fingers Mgate is set equal to 30, 60 and 90. Even if the size of the whole gate width (W×Mgate) is changed to some degree, the drain voltage waveform and the drain current waveform overlap little in time as appreciated from FIG. 5(a). Therefore, the power efficiency is anticipated to be high.

On the other hand, it is appreciated from FIG. 5(b) that the amplitudes of the output voltage and the output current can be controlled by changing the total gate width of the N-type MOSFET, even if only one set of passive parts including the inductor 31, the capacitor 32 and the band pass filter 33 connected to the drain of the N-type MOSFET 30 is used and values of them are fixed.

Figure 6A:
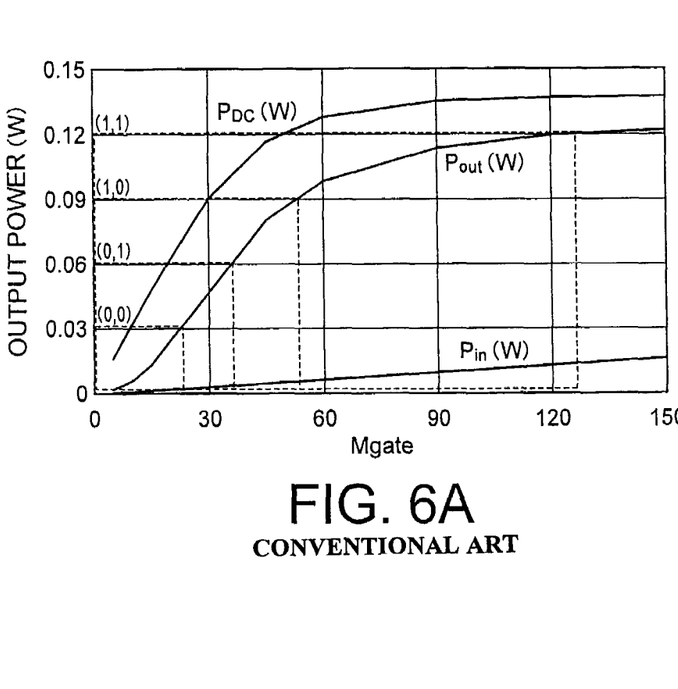
FIGS. 6A and 6B are graphs respectively showing output power and power efficiency as a function of the gate width in the E-class amplifier shown in FIG. 3.
Figure 6B:
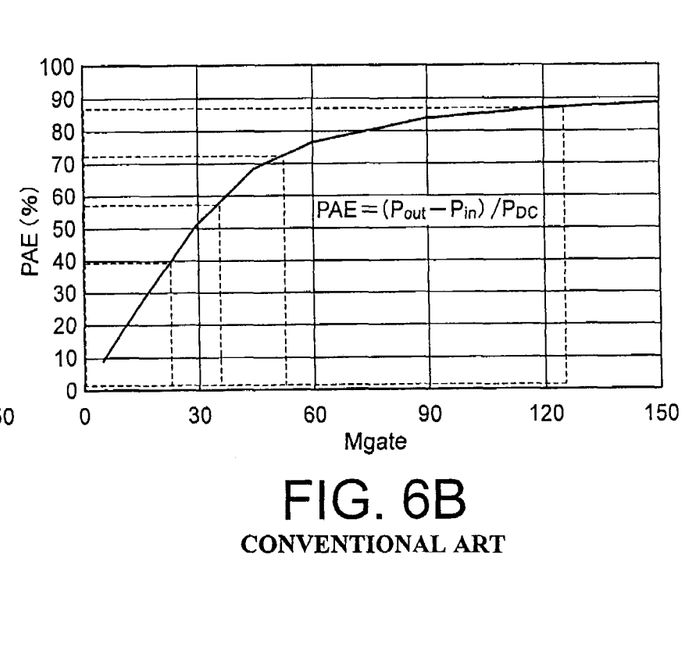

A change of the output power and a change of a power added efficiency obtained when the gate width W of the N-type MOSFET 30 is fixed to 5.2 μm and the number Mgate of gate fingers is changed from 5 to 150 are shown in FIG. 6A and FIG. 6B, respectively. In FIG. 6A, $P_{DC}$ denotes power supplied from the direct current voltage source 15, $P_{in}$ denotes power supplied from the input terminal 10, and $P_{out}$ denotes power output to the output terminal 20. The power added efficiency (PAE) shown in FIG. 6B is a value obtained from these values by using the following equation.

$$PAE(\text{Power Added Efficiency}) = \frac{(P_{OUT} - P_{IN})}{P_{DC}}$$

It is indicated from FIG. 6A that in the relation between the number of gate fingers and the output power the number of gates is not necessarily in proportion to the output power. For obtaining desired output power, therefore, it was necessary to change the number of gates of the N-type MOSFETs serving as the switches equal to the number of gates for obtaining desired output power. For example, when the number Mgate was 22, it is indicated from FIG. 6A that output power of 30 mW was obtained. When the number Mgate was 36, output power of 60 mW was obtained. When the number Mgate was 53, output power of 90 mW was obtained. When the number Mgate was 126, output power of 120 mW was obtained. The number of fingers and the output power are not necessarily in the proportional relation.

On the other hand, it is appreciated from the relation between the number of gate fingers and the power added efficiency (PAE) shown in FIG. 6B that an extremely high power efficiency of 87% was obtained at the time of a high output of 120 mW (Mgate=126). On the other hand, a power efficiency of no more than approximately 39% was obtained at the time of a low output of 30 mW (Mgate=22). At this time, the greater part of wasted energy becomes heat within the N-type MOSFET, resulting in a temperature rise.

In view of the facts described heretofore, a power amplifier of an embodiment described hereafter occurred to the present inventors.

Figure 7:
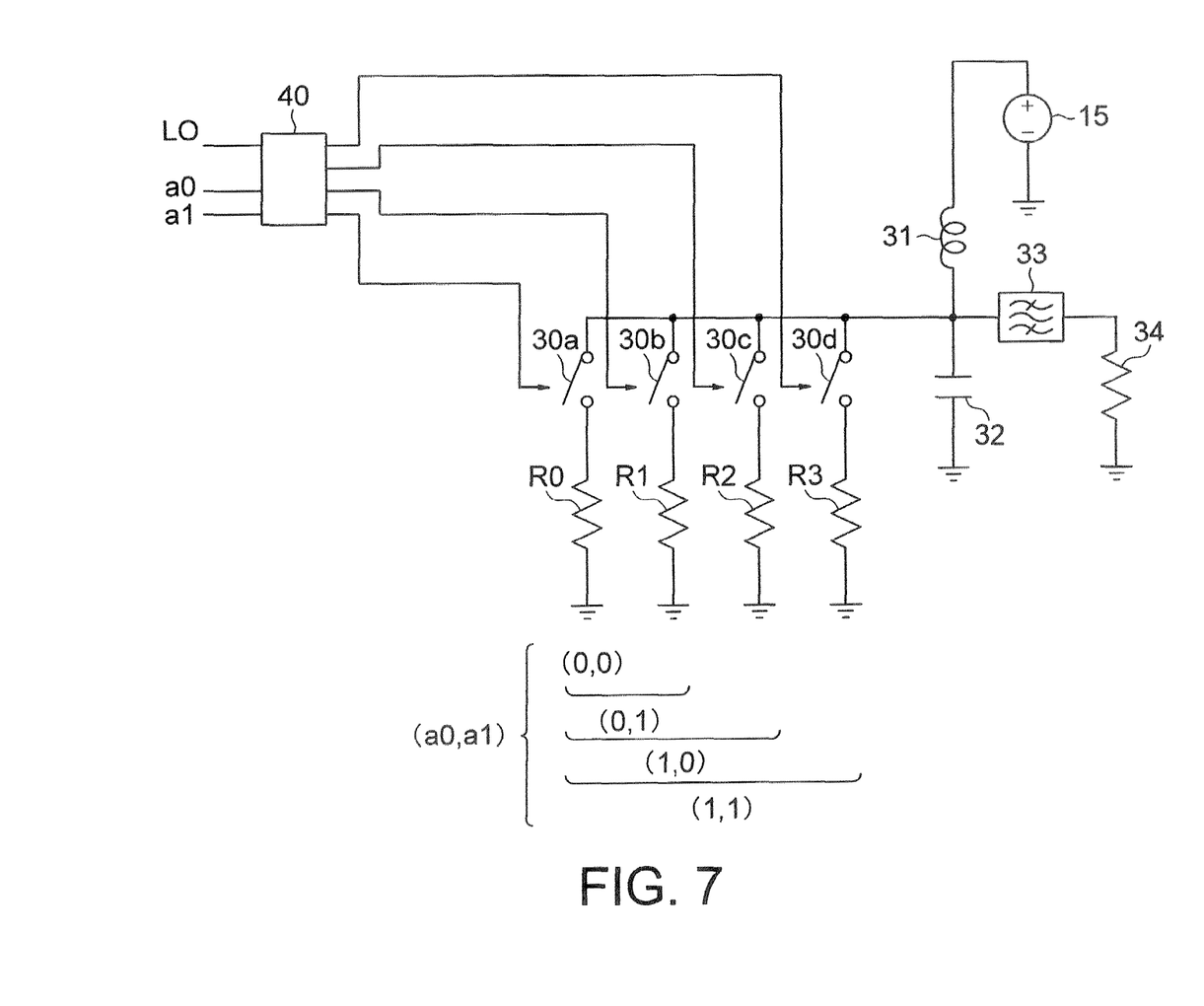
FIG. 7 is a circuit diagram showing a power amplifier according to an embodiment of the present invention.

A circuit configuration of a power amplifier according to an embodiment of the present invention is shown in FIG. 7.

The power amplifier according to the present embodiment includes a direct current voltage source 15, an inductor 31, a capacitor 32, a band pass filter 33, a resistor 34, switches 30a, 30b, 30c and 30d, and an amplitude controller 40. In FIG. 7, R0, R1, R2 and R3 represent serial resistors obtained when the switches 30a, 30b, 30c and 30d are turned on, respectively. In the same way as the ordinary E-class amplifier, an output portion includes a set of passive parts, i.e., the inductor 31, the capacitor 32, and the band pass filter 33. The amplitude controller 40 controls the on/off of the switches 30a, 30b, 30c and 30d on the basis of a clock signal LO and digital input signals a0 and a1.

In the power amplifier according to the present invention having such a configuration, resistances obtained when the switch 30a, 30b, 30c and 30d are turned on, i.e., the on-resistances R0, R1, R2 and R3 are different in value from each other and they do not have relations of natural number times (for example, relations of powers of 2).

Figure 8:
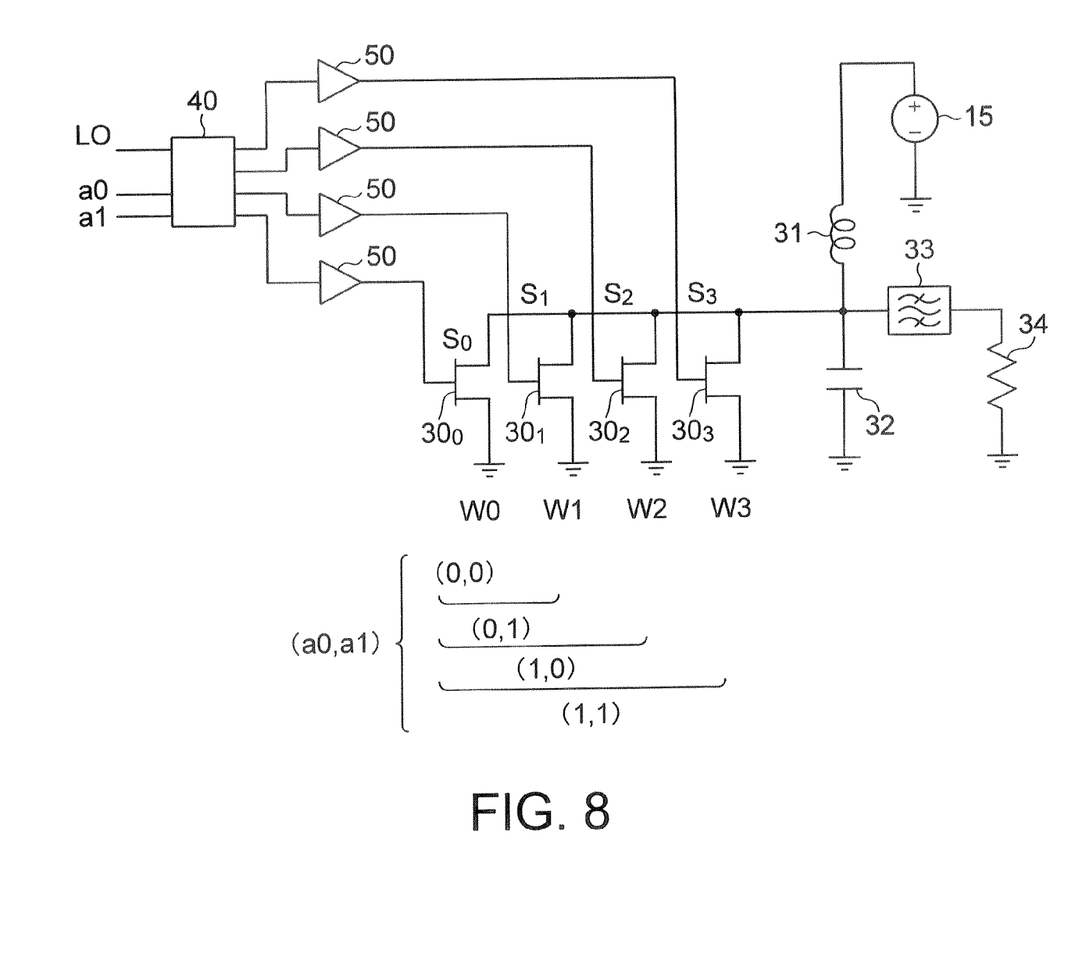
FIG. 8 is a circuit diagram of a power amplifier using a MOSFET as a switch according to an embodiment of the present invention.

An equivalent circuit of a circuit using N-type MOSFETs $30_0$, $30_1$, $30_2$ and $30_3$ as the switches 30a, 30b, 30c and 30d shown in FIG. 7 is shown in FIG. 8. In FIG. 8, driver amplifiers 50 are provided between output ends of the amplitude controller 40 and gates of the MOSFETs $30_0$, $30_1$, $30_2$ and $30_3$, respectively. In FIG. 8, characters W0, W1, W2 and W3 denote gate widths (channel widths) of the N-type MOSFETs $30_0$, $30_1$, $30_2$ and $30_3$, respectively. In the power amplifier of the present embodiment, the channel widths W0, W1, W2 and W3 respectively of the N-type MOSFETs $30_0$, $30_1$, $30_2$ and $30_3$ differ from each other and they do not have relations of natural number or integer times (for example, relations of powers of 2). In other words, resistances obtained when the N-type MOSFETs $30_0$, $30_1$, $30_2$ and $30_3$ are turned on do not have relations of natural number times.

Supposing that the N-type MOSFETs $30_0$, $30_1$, $30_2$ and $30_3$ have, for example, multi-finger structures in the present embodiment, the channel width per gate finger is set equal to 5.2 μm, W0 is set equal to 22 fingers, W1 is set equal to 14 (=36−22) fingers, W2 is set equal to 17 (=53−36) fingers, and W3 is set equal to 73 (=126−53) fingers. W0, W1, W2 and W3 thus selected neither have the same value, nor have relations of powers of 2. In other words, W0, W1, W2 and W3 do not have mutual relations of natural number times.

At this time, on the basis of the relation between the number of gate fingers and the output power shown in FIG. 6A, output power of 30 mW is obtained when only the N-type MOSFET $30_0$ is used. Output power of 60 mW is obtained when the two N-type MOSFETs $30_0$ and $30_1$ are used. Output power of 90 mW is obtained when the three N-type MOSFETs $30_0$, $30_1$, and $30_2$ are used. Output power of 120 mW is obtained when the four N-type MOSFETs $30_0$, $30_1$, $30_2$ and $30_3$ are used. In other words, as regards the output power, values of natural number times are obtained.

Figure 9:
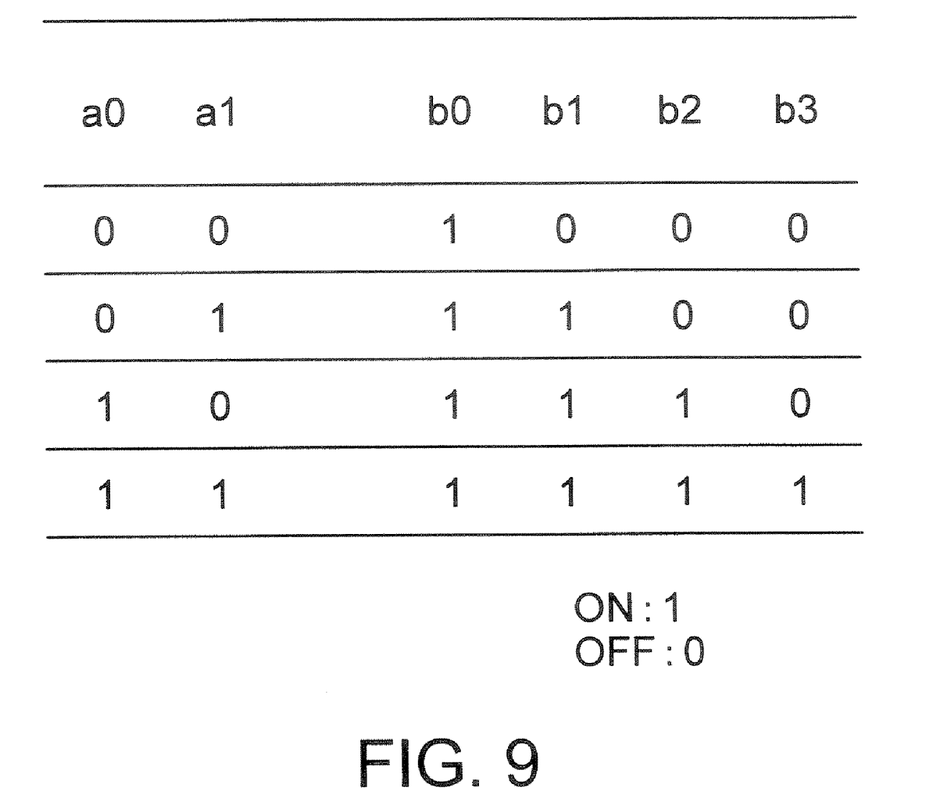
FIG. 9 is a diagram showing a relation between a digital input signal and a digital output signal.

FIG. 9 shows a true/false table of a logic circuit included in the amplitude controller 40, which drives the power amplifier shown in FIG. 8. FIG. 9 shows how 4-bit digital output signals b0, b1, b2 and b3 are output for four possible combinations of 2-bit digital input signals a0 and a1. By the way, the 2-bit digital input signals a0 and a1 become an address signal used to conduct selection on the N-type MOSFETs $30_0$, $30_1$, $30_2$ and $30_3$ and the logic circuit serves as a decode circuit. For example, when the digital output signal b0 is 1 in this truth table, a signal $S_0$ synchronized to a clock signal LO having a specific frequency is supplied to a corresponding N-type MOSFET $30_0$. When the digital output signal b1 is 1, a signal $S_1$ synchronized to the clock signal LO is supplied to a corresponding N-type MOSFET $30_1$. When the digital output signal b2 is 1, a signal $S_2$ synchronized to the clock signal LO is supplied to a corresponding N-type MOSFET $30_2$. When the digital output signal b3 is 1, a signal $S_3$ synchronized to the clock signal LO is supplied to a corresponding N-type MOSFET $30_3$.

On the other hand, when a digital signal bi (i=0, 1, 2, 3) is 0, a signal $S_i$ is not input to a corresponding switch or MOSFET $30_i$. In other words, the amplitude controller 40 is a digital circuit for exercising control to turn on and off switches or MOSFETs on the basis of the digital input signals a0 and a1.

Figure 10:
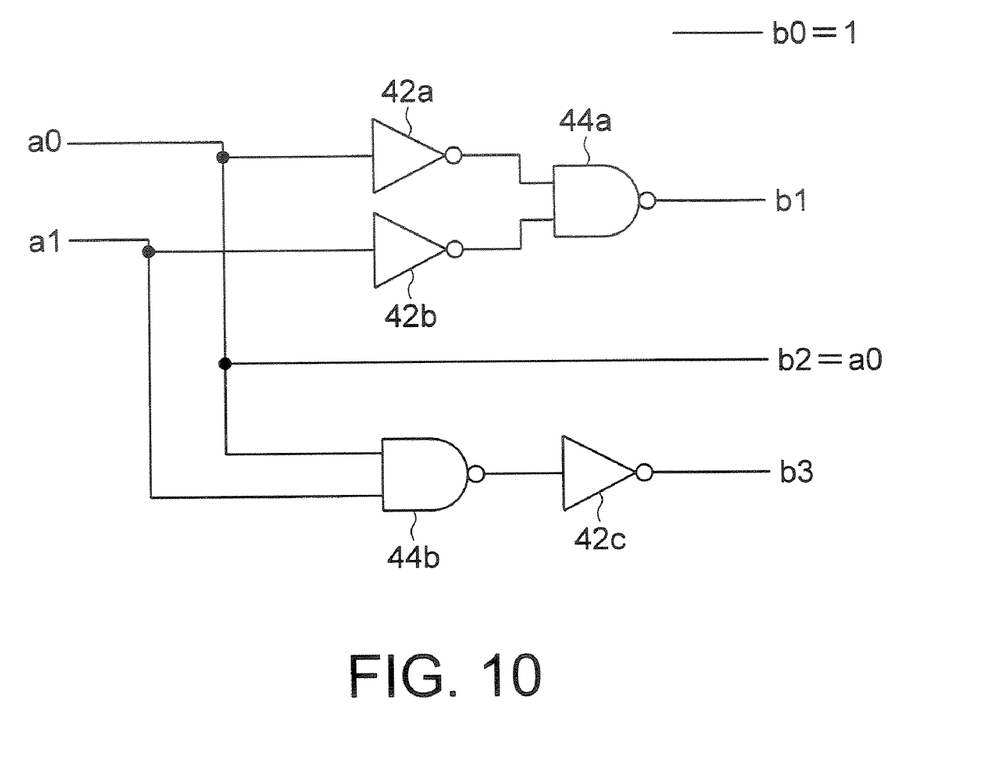
FIG. 10 is a circuit diagram showing a specific example of a logic circuit included in an amplitude controller according to an embodiment of the present invention.

An example of the logic circuit for implementing the true/false table shown in FIG. 9 is shown in FIG. 10. In this example, in this concrete example, the digital output signal b0 is always 1 for any digital input signals a0 and a1. As for the digital output signals b1, b2 and b3, desired digital outputs are obtained by combining inverters 42a, 42b and 42c with NAND circuits 44a and 44b with respect to the digital input signals a0 and a1. In other words, if a combination of the digital signals a0 and a1 is (0, 0), only the value of the digital output signal b0 is 1 and values of three other digital output signals b1, b2 and b3 are 0. At this time, the signal $S_0$ synchronized to the clock signal LO is input to only the N-type MOSFET $30_0$ and any signal is not input to three other N-type MOSFETs $30_1$, $30_2$ and $30_3$. As a result, output power of 30 mW is obtained from this power amplifier.

If a combination of the digital signals a0 and a1 is (0, 1), values of the digital output signals b0 and b1 are 1 and values of two other digital output signals b2 and b3 are 0. At this time, the signals $S_0$ and $S_1$ synchronized to the clock signal LO are input respectively to the N-type MOSFETs $30_0$ and $30_1$, and any signal is not input to two other N-type MOSFETs $30_2$ and $30_3$. As a result, output power of 60 mW is obtained from this power amplifier.

In the same way, if the combination of the digital input signals a0 and a1 is (1, 0), output power of 90 mW is obtained. If the combination of the digital input signals a0 and a1 is (1, 1), output power of 120 mW is obtained.

Figure 11:
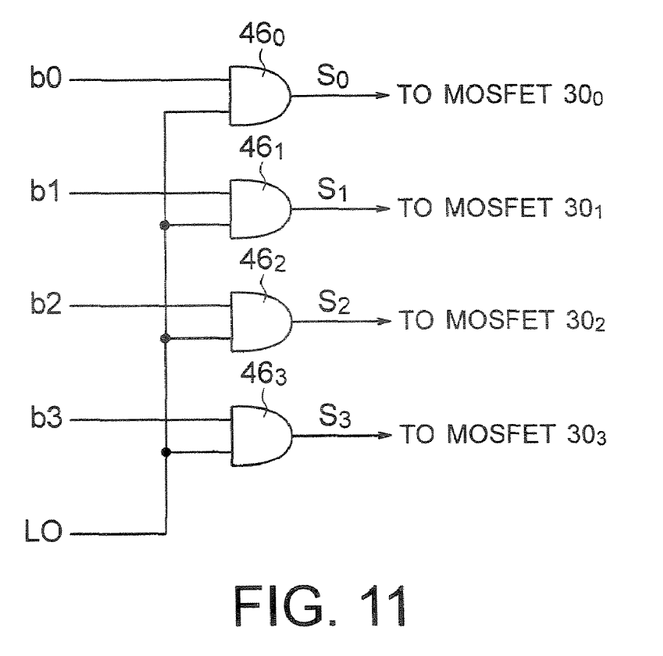
FIG. 11 is a circuit diagram showing a specific example of another logic circuit included in an amplitude controller according to an embodiment of the present invention.
Figure 12:
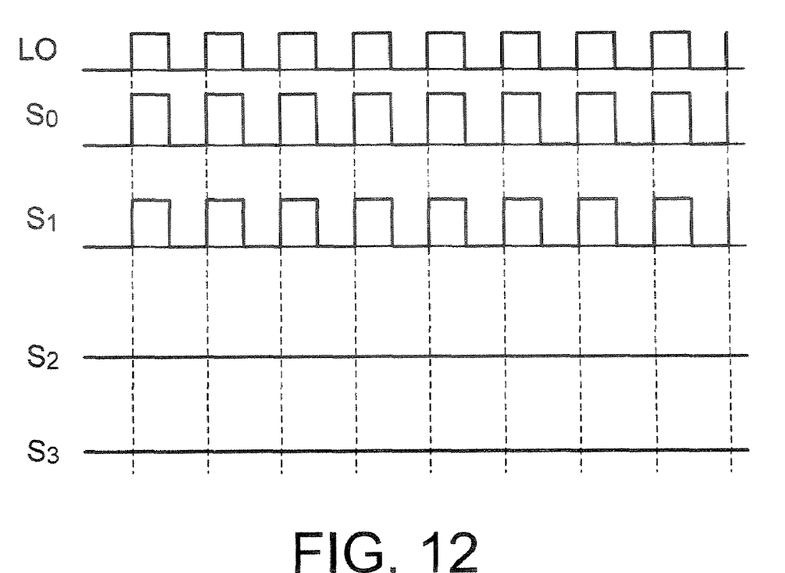
FIG. 12 is a timing chart showing operation of the logic circuit shown in FIG. 11.

An example of a logic circuit which forms the signals $S_0$, $S_1$, $S_2$ and $S_3$ respectively to be input to the gates of the N-type MOSFETs $30_0$, $30_1$, $30_2$ and $30_3$ via the driver amplifiers 50 on the basis of the digital output signals b0, b1, b2 and b3 is shown in FIG. 11. This logic circuit includes four AND circuits $46_0$, $46_1$, $46_2$ and $46_3$. The AND circuit $46_i$ (i=0, 1, 2, 3) performs an AND-ing function and outputs a signal $S_i$ to be input to the gate of the MOSFET $30_i$ via the driver amplifier 50. FIG. 12 shows a timing chart of the clock signal LO and signals $S_i$ input to gates of the MOSFETs $30_i$ (i=0, 1, 2, 3) when values of the digital input signals a0 and a1 are a0=0 and a1=1 in the logic circuit, i.e., b0=b1=1 and b2=b3=0.

Figure 13:
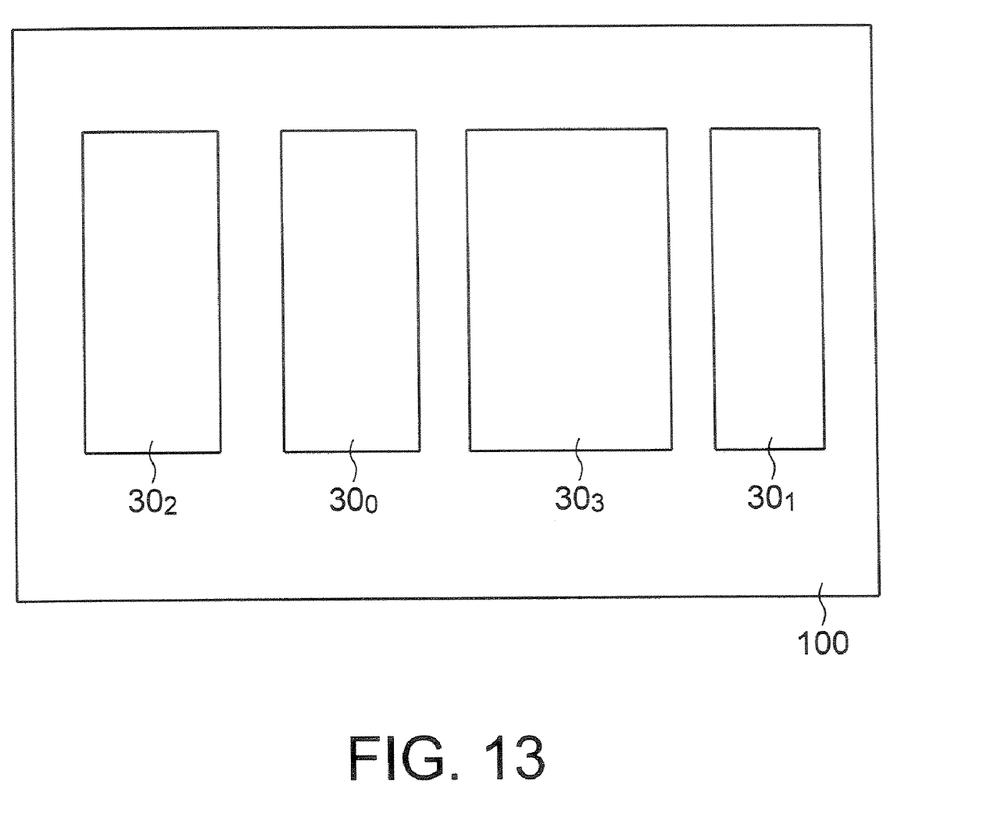
FIG. 13 is a diagram showing an example of a layout of a MOSFET in a power amplifier according to an embodiment of the present invention.

FIG. 13 shows an example of a layout of the MOSFETs $30_0$, $30_1$, $30_2$ and $30_3$ in the power amplifier according to the present embodiment on a substrate 100. In the circuit shown in FIG. 8, the four MOSFETs $30_0$, $30_1$, $30_2$ and $30_3$ are used. Among them, the MOSFET $30_0$ is only one transistor selected at the time of the lowest output power (30 mW) as described above. A transistor selected for the first time at the time of the second lowest output power (60 mW) is the MOSFET $30_1$. As evident from FIG. 6B, the efficiency of the power amplifier gets worse as the power output becomes lower. In other words, when only one MOSFET $30_0$ is used or when only two MOSFETs $30_0$ and $30_1$ are used, the power efficiency is low and consequently the individual MOSFETs generate a large amount of heat. Therefore, it is desirable to keep the MOSFETs in operation with low power, in the example shown in FIG. 8 which are the MOSFET $30_0$ and the MOSFET $30_1$, apart from each other as far as possible. Since the heat generation portions are separated, heat concentration is avoided and it is possible to prevent the temperature rise of the substrate 100. In the present embodiment, the MOSFET $30_3$ having the largest number of fingers is disposed between the MOSFET $30_0$ and the MOSFET $30_1$ to prevent the MOSFET $30_0$ and the MOSFET $30_1$ from being adjacent to each other.

In the same way, the MOSFET $30_0$ and the MOSFET $30_3$ are disposed between the MOSFET $30_2$ selected for the first time at the time of the third lowest output power (90 mW) and the MOSFET $30_1$ selected for the first time at the time of the second lowest output power (60 mW). As a result, the MOSFET $30_1$ and the MOSFET $30_2$ are prevented from being adjacent to each other. In addition, the MOSFET $30_0$ is disposed between the MOSFET $30_3$ selected for the first time at the time of the fourth lowest output power (120 mW) and the MOSFET $30_2$ selected for the first time at the time of the third lowest output power (90 mW). As a result, the MOSFET $30_2$ and the MOSFET $30_3$ are prevented from being adjacent to each other. Since the heat generation portions are separated in such an arrangement, heat concentration is avoided and it is possible to prevent the temperature rise of the substrate 100.

Firstly, in the present embodiment, the power efficiency can be raised (to at least 80%) by using an E-class amplifier as heretofore described. The E-class amplifier has features of a low power supply voltage, fast switching, and good compatibility with the CMOS process. Secondly, the output power can be controlled digitally by connecting a plurality of switches in parallel. Thirdly, it is possible to make the relation between the number of switches turned on and off and the output power linear by setting on-resistances of the individual switches equal to different values. Fourthly, the influence of heat generation can be reduced by increasing the distances between the switches which turn on and off at the time of low power output.

In the present embodiment, it is supposed that the input digital signal for controlling the amplitude has 2 bits and the method for changing the output amplitude in four stages according to the 2 bits has been described, in order to simplify the description. In the same way, however, it is possible to increase the range of the output amplitude which can be controlled by increasing the number of bits.

The present embodiment has been described by taking the E-class amplifier as an amplifying unit. However, the present embodiment can be applied to amplifiers of the type using transistors as switches, such as D-class amplifiers and F-class amplifiers, as well in the same way.

The present embodiment makes it possible to decrease the passive parts as far as possible and decrease the cost in the power amplifier which controls power by using a digital signal. As regards the passive parts, therefore, only one set which is the minimum requirement to implement the E-class amplifier is used. On the other hand, as for active parts, i.e., FETs, size reduction is originally possible and consequently many active parts enough to implement desired linearity are used. The maximum output is obtained when all FETs are selected. It is desirable to select a configuration of passive parts so as to raise the power efficiency to the utmost at this time.

It is desirable that a plurality of FETs are MOSFETs formed on the same substrate using not the compound semiconductor process but the CMOS process. As a result, the power amplifier can be formed on the same substrate as the controller formed of a digital logic circuit to control the output. It is possible to prevent the area of the FETs from becoming large as compared with the case where division is not conducted, by a layout contrivance such as sharing a part of the source region with other FETs.

In the power amplifier according to the present embodiment, it becomes possible to exercise minute control on the power of the output signal having non-constant amplitude by using a plurality of FETs as switch elements of the E-class amplifier used in communication using the digital modulation method and bringing only selected FETs into operation on the basis of a signal of the amplitude controller.

In the power amplifier according to the present embodiment, a plurality of FETs are provided and only one set of passive parts which are the minimum requirement is used. When integrating active parts and passive parts on the same substrate, passive parts such as inductors and transmission lines need a larger area. Therefore, it is possible to decrease the number of passive parts remarkably and hold down the cost remarkably by adopting such a circuit configuration.

In the power amplifier according to the present embodiment, the individual FETs do not always operate in the saturation region, depending on the number of selected FETs. If channel widths of all FETs are the same, therefore, the number of the selected active elements is not always in proportion to the output amplitude. In the power amplifier according to the present embodiment, it is possible to achieve a desired relation (proportional relation) between the number of FETs selected by the amplitude controller and the output power by setting the channel widths of the individual FETs to predetermined non-natural number times so as to make the channel widths of the FETs selected at the time of low output different from the channel widths of the FETs selected at the time of high output.

In addition, in the power amplifier according to the present embodiment, gate fingers are divided in FETs used at the time of low output among a plurality of FETs, and FETs obtained by the division are disposed in separate positions. The reason will now be described. In the power amplifier according to the present embodiment, only one set of passive elements is used. If a combination of passive parts is selected so as to have the best power efficiency at the time of high output, therefore, the power efficiency is not always so good at the time of low output. As a result, partial wasteful power is converted to heat in the FETs. Because of the temperature rise of the FETs, the characteristics vary with time. It is possible to scatter heat generation portions and hold down the temperature rise by disposing gate fingers of FETs selected at the time of low output when the efficiency is low scatteringly. As a result, stable output characteristics can be obtained.

According to the present embodiment, it is possible to obtain a power amplifier that can be made inexpensive as far as possible and variable in output amplitude, as heretofore described.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A power amplifier comprising:
a plurality of field effect transistors connected in parallel and each having a first and second ends, the first end being connected to ground, and channel widths of the field effect transistors being different from each other, a gate of each of the field effect transistors being divided into a plurality of gate fingers;
an amplifying unit which comprises at least one of an inductor, a capacitor and a band pass filter and has a third and fourth ends, the third end being connected to the second ends of the field effect transistors, and the fourth end outputting an amplified output signal; and
an amplitude controller which sends control signals respectively to gates of the field effect transistors to turn on or off the field effect transistors based on an address signal for performing selection on the field effect transistors and a clock signal, wherein
selection is performed on the field effect transistors so as to make an output power of the amplifying unit proportional to the number of field effect transistors which are in their on-state among the field effect transistors,
the field effect transistors are formed on a same substrate, and
the field effect transistors are arranged so as to prevent a field effect transistor selected for the first time at time of an output of Nth (where N≧2) lowest output power and a field effect transistor selected for the first time at time of an output of (N+1)th lowest output power from being adjacent to each other.

2. The power amplifier according to claim 1, wherein the amplifying unit is any one of a D-class amplifier, an E-class amplifier and an F-class amplifier.

3. The power amplifier according to claim 1, wherein
the amplifying unit comprises an inductor having a fifth and sixth ends, the fifth end being connected to a direct current voltage source and the sixth end being connected to the second ends of the field effect transistors, a capacitor having a seventh and eighth ends, the seventh end being connected to the sixth end of the inductor and the eighth end being connected to the ground, and a band pass filter having a ninth end connected to the seventh end of the capacitor, and
an output of the band pass filter corresponds to the amplified output signal of the amplifying unit.

4. A power amplifier comprising:
a plurality of switches connected in parallel and each having a first and second ends, the first end being connected to ground, and on-resistance values of the switches being different from each other;
an amplifying unit which comprises at least one of an inductor, a capacitor and a band pass filter and has a third and fourth ends, the third end being connected to the second ends of the switches, and the fourth end outputting an amplified output signal; and
an amplitude controller which sends control signals respectively to the switches to turn on or off the switches based on an address signal for performing selection on the switches and a clock signal, wherein
selection is performed on the switches so as to make the output power of the amplifying unit proportional to the number of switches which are in their on-state among the switches,
the switches are formed on a same substrate, and
the switches are arranged so as to prevent a switch selected for the first time at time of an output of Nth (where N≧2) lowest output power and a switch selected for the first time at time of an output of (N+1)th lowest output power from being adjacent to each other.

5. The power amplifier according to claim 4, wherein the amplifying unit is any one of a D-class amplifier, an E-class amplifier and an F-class amplifier.

6. The power amplifier according to claim 4, wherein
the amplifying unit comprises an inductor having a fifth and sixth ends, the fifth end being connected to a direct current voltage source and the sixth end being connected to the second ends of the switches, a capacitor having a seventh and eighth ends, the seventh end being connected to the sixth end of the inductor and the eighth end being connected to the ground, and a band pass filter having a ninth end connected to the seventh end of the capacitor, and an output of the band pass filter corresponds to the amplified output signal of the amplifying unit.

7. A power amplifier comprising:

a plurality of field effect transistors connected in parallel and each having a first and second ends, the first end being connected to ground, and channel widths of the field effect transistors being different from each other;

an amplifying unit which comprises at least one of an inductor, a capacitor and a band pass filter and has a third and fourth ends, the third end being connected to the second ends of the field effect transistors, and the fourth end outputting an amplified output signal; and an amplitude controller which sends control signals respectively to gates of the field effect transistors to turn on or off the field effect transistors based on an address signal for performing selection on the field effect transistors and a clock signal, wherein selection is performed on the field effect transistors so as to make an output power of the amplifying unit proportional to the number of field effect transistors which are in their on-state among the field effect transistors, and wherein the field effect transistors are formed on a same substrate, and the field effect transistors are arranged so as to prevent a field effect transistor selected for the first time at time of an output of Nth (where $N \geqq 2$) lowest output power and a field effect transistor selected for the first time at time of an output of (N+1)th lowest output power from being adjacent to each other.

8. The power amplifier according to claim 7, wherein the amplifying unit comprises an inductor having a fifth and sixth ends, the fifth end being connected to a direct current voltage source and the sixth end being connected to the second ends of the field effect transistors, a capacitor having a seventh and eighth ends, the seventh end being connected to the sixth end of the inductor and the eighth end being connected to the ground, and a band pass filter having a ninth end connected to the seventh end of the capacitor, and an output of the band pass filter corresponds to the amplified output signal of the amplifying unit.

9. The power amplifier according to claim 7, wherein the amplifying unit is any one of a D-class amplifier, an E-class amplifier and an F-class amplifier.

* * * * *